United States Patent
Zhou et al.

(10) Patent No.: US 11,128,255 B1
(45) Date of Patent: Sep. 21, 2021

(54) OSCILLATOR CIRCUIT

(71) Applicant: Shanghai Zhaoxin Semiconductor Co., Ltd., Shanghai (CN)

(72) Inventors: Yongqi Zhou, Beijing (CN); Xiaoguang Wang, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 17/085,041

(22) Filed: Oct. 30, 2020

(30) Foreign Application Priority Data

Sep. 29, 2020 (CN) .......................... 202011056227.X (51) Int. Cl.
*H03B 5/12* (2006.01)
*H03B 5/24* (2006.01)
*H03B 5/06* (2006.01)

(52) U.S. Cl.
CPC ............. *H03B 5/1209* (2013.01); *H03B 5/06* (2013.01); *H03B 5/1228* (2013.01)

(58) Field of Classification Search
CPC ....... H03B 5/1209; H03B 5/1228; H03B 5/06
USPC ................................................ 331/108 R, 57
See application file for complete search history.

(56) References Cited

U.S. PATENT DOCUMENTS

| | | | | |
|---|---|---|---|---|
| 6,294,962 B1* | 9/2001 | Mar | ...................... | H03K 3/0231 331/111 |
| 8,054,139 B2* | 11/2011 | Fernandez | ........... | H03K 3/0322 331/57 |
| 9,325,277 B1* | 4/2016 | Bekele | ................. | H03B 5/1278 |
| 2006/0214739 A1* | 9/2006 | Kang | ..................... | H03K 3/015 331/57 |
| 2008/0061894 A1* | 3/2008 | Raita | ........................ | H03L 1/00 331/57 |
| 2011/0156819 A1* | 6/2011 | Kim | ..................... | H03F 3/45659 330/296 |

* cited by examiner

*Primary Examiner* — Richard Tan
(74) *Attorney, Agent, or Firm* — McClure, Qualey & Rodack, LLP (57) ABSTRACT

An oscillator circuit comprises differential amplifiers connected in series and an auxiliary start circuit. A first output terminal and a second output terminal of each differential amplifier are respectively coupled to a first input terminal and a second input terminal of the next differential amplifier. Said first output terminal of the last differential amplifier is coupled to said second input terminal of the first differential amplifier. Said second output terminal of said last differential amplifier is coupled to said first input terminal of said first differential amplifiers. Said auxiliary start circuit generates a first disturbance signal and a second disturbance signal to said first input terminal and said second input terminal of a second differential amplifier according to said signal state of said first input terminal of a first differential amplifier. Said first different amplifier is one of said differential amplifiers. Said second differential amplifier is another differential amplifier.

10 Claims, 5 Drawing Sheets

OSCILLATOR CIRCUIT

CROSS REFERENCE TO RELATED APPLICATIONS

This application claims priority of China Patent Application No. 202011056227.X, filed on Sep. 29, 2020, the entirety of which is incorporated by reference herein.

BACKGROUND OF THE INVENTION

Field of the Invention

The present invention relates to an oscillator, and in particular, relates to an oscillator circuit.

Description of the Related Art

In a conventional oscillator, the oscillation frequency is determined by the delay of inverters inside the oscillator. However, the inverters inside the oscillator are sensitive to the power supply noise, so that the jitter of the oscillator is large and a rejection effect on power supply noise is poor.

Therefore, how to effectively reject the jitter of the oscillator and the power supply noise has become a focus for technical improvements by various manufacturers.

BRIEF SUMMARY OF THE INVENTION

The present invention provides an oscillator circuit, the oscillator circuit may reject the power supply noise and widen the frequency range of oscillation.

The present invention provides an oscillator circuit, which comprises a plurality of differential amplifiers connected in series and an auxiliary start circuit. A first output terminal and a second output terminal of each of said plurality of differential amplifiers are respectively coupled to a first input terminal and a second input terminal of next one of said plurality of differential amplifiers. Said first output terminal of the last one of said plurality of differential amplifiers is coupled to said second input terminal of the first one of said plurality of differential amplifiers. Said second output terminal of said last one of said plurality of differential amplifiers is coupled to said first input terminal of said first one of said plurality of differential amplifiers. Said auxiliary start circuit generates a first disturbance signal and a second disturbance signal to said first input terminal and said second input terminal of a second differential amplifier according to said signal state of said first input terminal of a first differential amplifier. Said first different amplifier is one of said plurality of differential amplifiers. Said second differential amplifier is another one of said plurality of differential amplifiers.

According to the oscillator circuit disclosed by the present invention, the ratio of negative resistance and positive resistance inside the differential amplifier is controlled by the first digital control signal and the second digital control signal to adjust the oscillation frequency of the oscillator circuit, so that the differential amplifier is insensitive to the power supply noise. In addition, the auxiliary start circuit generates the first disturbance signal and the second disturbance signal to the first input terminal and the second input terminal of the j-th differential amplifier according to the signal state of the first input terminal of the i-th differential amplifier, and the auxiliary start circuit may widen the maximum use range of the negative resistance, i.e., widen the frequency range that the oscillator may oscillate. Therefore, the oscillator circuit may highly reject the power supply noise and widen the frequency range of oscillation, and ensure the normal oscillation of the oscillator circuit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In each of the following embodiments, the same reference number represents an element or component that is the same or similar.

Figure 1:
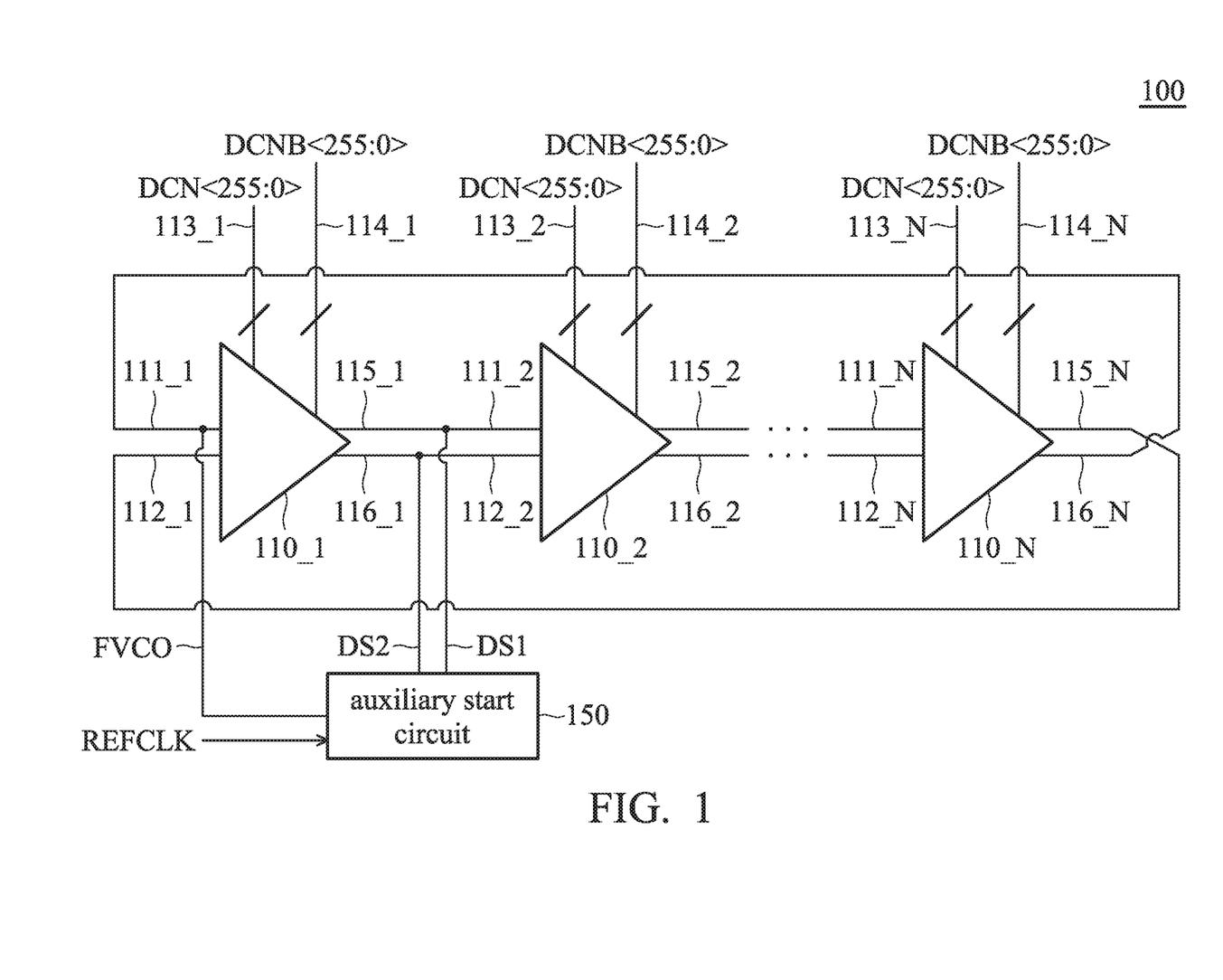
FIG. 1 is a schematic view of an oscillator circuit 100 according to an embodiment of the present invention.

FIG. 1 is a schematic view of an oscillator circuit 100 according to an embodiment of the present invention. Please refer to FIG. 1. The oscillator circuit 100 includes N differential amplifiers 110_1~110_N connected in series and an auxiliary start circuit 150, herein N is an integer greater than 1.

The N differential amplifiers 110_1~110_N respectively include a first input terminal, a second terminal, a plurality of third terminals, a plurality of fourth terminals, a first output terminal and a second output terminal. For example, the first differential amplifier 110_1 includes the first input terminal 111_1, the second input terminal 112_1, the plurality of third input terminals 113_1, the plurality of fourth input terminals 114_1, the first output terminal 115_1 and the second output terminal 1161. The second differential amplifier 110_2 includes the first input terminal 111_2, the second input terminal 112_2, the plurality of third input terminals 113_2, the plurality of fourth input terminals 114_2, the first output terminal 115_2 and the second output terminal 116_2 . . . . The N-th differential amplifier 110_N includes the first input terminal 111_N, the second input terminal 112_N, the plurality of third input terminals 113_N, the plurality of fourth input terminals 114_N, the first output terminal 115_N and the second output terminal 116_N.

In the embodiment, the first output terminal of the i-th differential amplifier is coupled to the first input output terminal of the (i+1)-th differential amplifier, wherein 1≤i<N. For example, the first output terminal 115_1 of the first differential amplifier 110_1 is coupled to the first input terminal 111_2 of the second differential amplifier 110_2. The first output terminal 115_2 of the second different amplifier 1102 is coupled to the first input terminal 111_3 of the third differential amplifier 110_3 . . . . The first output terminal 115_N−1 of the (N−1)-th differential amplifier 110_N−1 is coupled to the first input terminal 111_N of the N-th differential amplifier 110_N.

The second output terminal of the i-th differential amplifier is coupled to the second input output terminal of the (i+1)-th differential amplifier. For example, the second output terminal 116_1 of the first differential amplifier 110_1 is coupled to the second input terminal 112_2 of the second differential amplifier 110_2. The second output terminal 116_2 of the second differential amplifier 110_2 is coupled to the second input terminal 112_3 of the third differential amplifier 110_3 . . . . The second output terminal 116_N−1 of the (N−1)-th differential amplifier 110_N−1 is coupled to the second input terminal 112_N of the N-th differential amplifier 110_N.

The first output terminal 115_N of the N-th differential amplifier 110_N is coupled to the second input terminal 112_1 of the first differential amplifier 110_1. The second output terminal 116_N of the N-th differential amplifier 110_N is coupled to the first input terminal 111_1 of the first differential amplifier 110_1.

The plurality of third input terminals 113_1~113_N of the differential amplifiers 110_1~110_N receive bit signals DCN<0>~DCN<255> of a first digital control signal DCN<255:0>. The plurality of fourth input terminals 114_1~114_N of the differential amplifiers 110_1~110_N receive bit signals DCNB<0>~DCNB<255> of a second digital control signal DCNB<255:0>. In the embodiment, bit numbers of the first digital control signal and the second digital control signal are, for example, 256 (8-th power of 2). The bit numbers (256) of the first digital control signal DCN<255:0> and the second digital control signal DCNB<255:0> are one exemplary embodiment of the present invention, but the embodiment of the present invention is not limited thereto. The user may adjust the bit numbers of the first digital control signal and the second digital control signal according to the requirements thereof.

In the embodiment, the bit signals DCN<0>~DCN<255> of the first digital control signal DCN<255:0> are complementary to the bit signals DCNB<0>~DCNB<255> of the second digital control signal DCNB<255:0>. For example, when the bit signal DCN<0> of the first digital control signal DCN<255:0> is at a high level (i.e., "1") and the bit signals DCN<1>~DCN<255> of the first digital control signal DCN<255:0> are at a low level (i.e., "0"), the bit signal DCNB<0> of the second digital control signal DCNB<255:0> is at the low level and the bit signals DCNB<1>~DCNB<255> of the second digital control signal DCNB<255:0> are at the high level. When the bit signals DCN<0>~DCN<5> of the first digital control signal DCN<255:0> are at the high level and the bit signals DCN<6>~DCN<255> of the first digital control signal DCN<255:0> are at the low level, the bit signals DCNB<0>~DCNB<5> of the second digital control signal DCNB<255:0> are at the low level and the bit signals DCNB<6>~DCNB<255> of the second digital control signal DCNB<255:0> are at the high level. Other relationships between the bit signals DCN<0>~DCN<255> of the first digital control signal DCN<255:0> and the bit signals DCNB<0>~DCNB<255> of the second digital control signal DCNB<255:0> are similar.

In addition, the first digital control signal DCN<255:0> and the second digital control signal DCNB<255:0> respectively are mixed coding of a thermometer code and a binary code. For example, the lowest bit is the binary code, and the other bits are the thermometer code.

The auxiliary start circuit 150 is coupled to the first input terminal of the i-th differential amplifier and the first input terminal and the second input terminal of the j-th differential amplifier, wherein 1<j≤N. In generally, the auxiliary start circuit 150 is coupled to the first input terminal of one differential amplifier and the first input terminal and the second input terminal of the other differential amplifier among the N differential amplifiers 110_1~110_N connected in series. In the embodiment, the auxiliary start circuit 150 is coupled to the first input terminal of the i-th differential amplifier and the first input terminal and the second input terminal of the j-th differential amplifier as an example, but the present invention is not limited thereto. For example, the auxiliary start circuit 150 may be coupled to the first input terminal 111_1 of the first differential amplifier 110_1 and the first input terminal 111_2 and the second input terminal 112_2 of the second differential amplifier 110_2, but the present invention is not limited thereto. Or, the auxiliary start circuit 150 may be coupled to the first input terminal 111_2 of the second differential amplifier 110_2 and the first input terminal 111_5 and the second input terminal 112_5 of the fifth differential amplifier 110_5. Or, the auxiliary start circuit 150 may be coupled to the first input terminal 111_3 of the third differential amplifier 110_3 and the first input terminal 111_6 and the second input terminal 112_6 of the sixth differential amplifier 110_6. The users may connect the auxiliary start circuit 150 to needed differential amplifiers according to their own needs. Furthermore, the auxiliary start circuit 150 further receives a reference clock signal REFCLK.

The auxiliary start circuit 150 generates a first disturbance signal DS1 and a second disturbance signal DS2 according to the signal state of the first input terminal of the i-th differential amplifier and the reference clock signal REFCLK and outputs the first disturbance signal DS1 and the second disturbance signal DS2 to the first output terminal and the second output terminal of the j-th differential amplifier. For example, in the embodiment shown in FIG. 1, the auxiliary start circuit 150 may generate the first disturbance signal DS1 and the second disturbance signal DS2 according to the state of the signal FVCO of the first input terminal 111_1 of the first differential amplifier 110_1 and the reference clock signal REFCLK and output the first disturbance signal DS1 and the second disturbance signal DS2 to the first input terminal 111_2 and the second input terminal 112_2 of the second differential amplifier 110_2.

Specifically, When the state of the signal FVCO of the first input terminal 111_i of the i-th differential amplifier 110_i is no oscillation, the frequencies of the first disturbance signal DS1 and the second disturbance signal DS2 generated by the auxiliary start circuit 150 are, for example, the same as the frequency of the reference clock signal REFCLK. The auxiliary start circuit 150 outputs the first disturbance signal DS1 and the second disturbance signal DS2 with the same frequency as the reference clock signal REFCLK to the first input terminal 111_j and the second input terminal 112_j of the j-th differential amplifier 110_j, to oscillate the differential amplifiers 110_1~110_N. That is, when the oscillator circuit 100 may not oscillate normally, the disturbance signals provided by the auxiliary circuit 150 may make the oscillator circuit 100 resume oscillation. Herein, when the frequencies of the first disturbance signal DS1 and the second disturbance signal DS2 are the same as the frequency of the reference clock signal REFCLK, the phase difference between the first disturbance signal DS1 and the second disturbance signal DS2 is 180 degrees.

When the state of the signal FVCO of the first input terminal 111_i of the i-th differential amplifier 110_i is oscillating, indicates that the differential amplifiers 110_1~110_N (i.e., the oscillator circuit 100) are oscillating normally. For the first input terminal 111_j and the second input terminal 112_j of the differential amplifier 110_j, the first disturbance signal DS1 and the second disturbance signal DS2 generated by the auxiliary start circuit 150 are in a high impedance (high-z) state. That is, the auxiliary start circuit 150 outputs the first disturbance signal DS1 and the second disturbance signal DS2 in the high impedance (high-z) state to the first input terminal 111_j and the second input terminal 112_j of the second differential amplifier 110_j, so that the first disturbance signal DS1 and the second disturbance signal DS2 no longer interfere with the oscillation of the differential amplifiers 110_1~110_N. That is, when the oscillator circuit 100 oscillates normally, the disturbance signals provided by the auxiliary start circuit 150 no longer interferes with the oscillation of the oscillator circuit 100.

Furthermore, auxiliary start circuit 150 continuously monitors the state of the signal FVCO of the first input terminal 111_i of the i-th differential amplifier 110_i, so as to adjust the state of the first disturbance signal DS1 and the second disturbance signal DS2, thereby ensuring that the oscillator circuit 100 may always oscillate normally.

Figure 2:
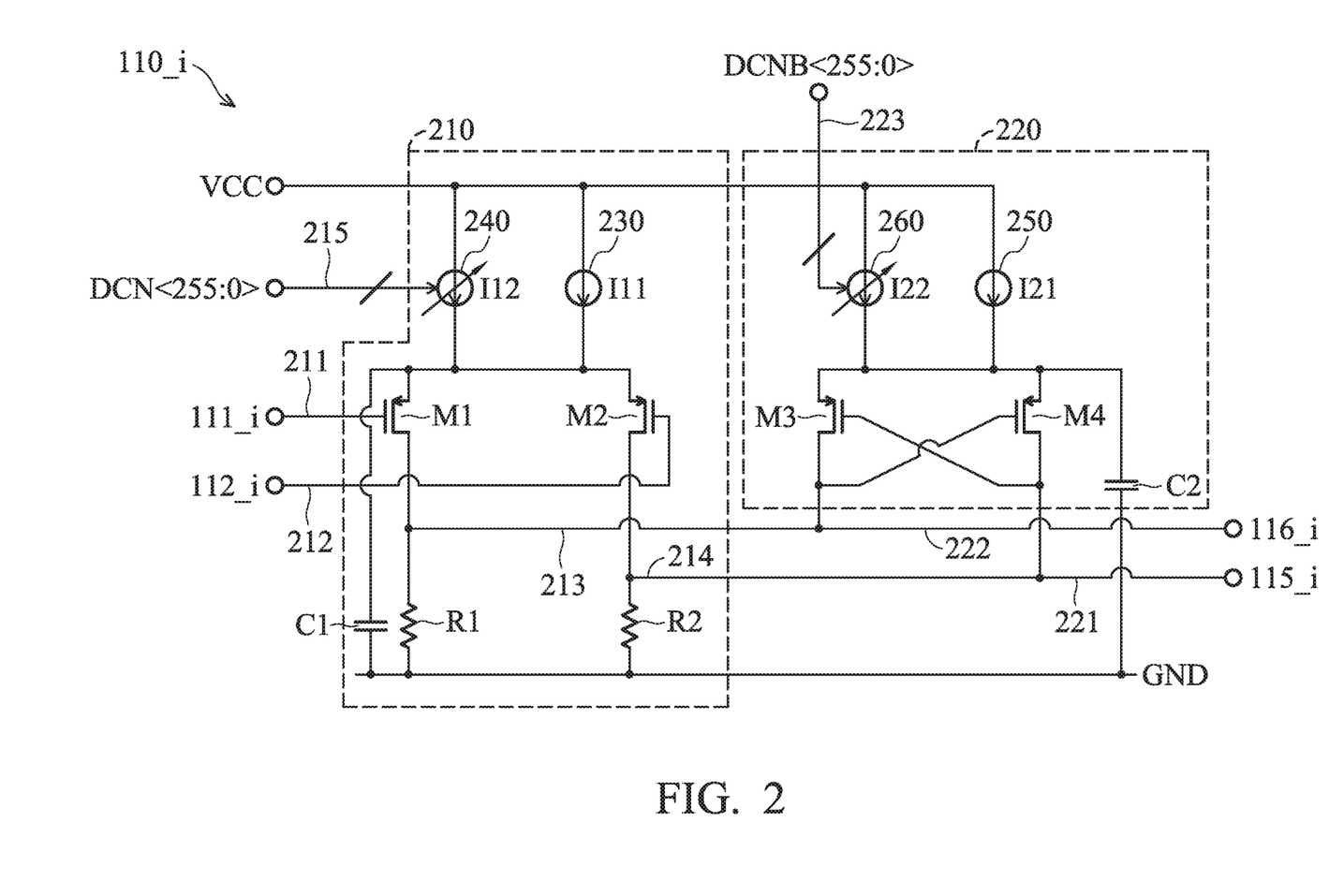
FIG. 2 is a circuit diagram of a differential amplifier 110_$i$ in FIG. 1.

FIG. 2 is a detailed circuit diagram of a differential amplifier 110_i in FIG. 1. As shown in FIG. 2, the differential amplifier 110_i includes an amplifier stage circuit 210 and a negative-resistance stage circuit 220. The amplifier stage circuit 210 includes a first terminal 211, a second terminal 212, a third terminal 213, a fourth terminal 214 and a plurality of fifth terminals 215. According to an embodiment of the present invention, the first terminal 211 of the amplifier stage circuit 210 is used as the first input terminal 111_i of the i-th differential amplifier 110_i. The second terminal 212 of the amplifier stage circuit 210 is used as the second input terminal 112_i of the i-th differential amplifier 110_i. The plurality of fifth terminals 215 of the amplifier stage circuit 210 is used as the plurality of third input terminals 113_i of the i-th differential amplifier 110_i and receive the first digital control signal DCN<255:0>, herein, the first digital control signal DCN<255:0> may be used to adjust the gain of the amplifier stage circuit 210, so as to adjust the gain of the differential amplifier 110_i.

The negative-resistance stage circuit 220 includes a first terminal 221, a second terminal 222 and a plurality of third terminals 223. According to an embodiment of the present invention, the first terminal 221 of the negative-resistance stage circuit 220 is used as the first output terminal 115_i of the i-th differential amplifier 110_i. The second terminal 222 of the negative-resistance stage circuit 220 is used as the second output terminal 116_i of the i-th differential amplifier 110_i. The plurality of third terminals 223 of the negative-resistance stage circuit 220 is used as the plurality of fourth input terminals 114_i of the i-th differential amplifier 110_i and receive the second digital control signal DCNB<255:0>, herein, the second digital control signal DCNB<255:0> may be used to adjust the negative resistance of the negative-resistance stage circuit 220, so as to adjust the output impedance of the differential amplifier 110_i.

Furthermore, the amplifier stage circuit 210 includes a P-type transistor M1, a P-type transistor M2, a constant current source 230, an adjustable current source 240, a resistor R1, a resistor R2 and a capacitor C1.

The P-type transistor M1 includes a gate, a drain and a source. The gate of the P-type transistor M1 is used as the first terminal 211 of the amplifier stage circuit 210. The drain of the P-type transistor M1 is used as the third terminal 213 of the amplifier stage circuit 210. The P-type transistor M2 includes a gate, a drain and a source. The gate of the P-type transistor M2 is used as the second terminal 212 of the amplifier stage circuit 210. The drain of the P-type transistor M2 is used as the fourth terminal 214 of the amplifier stage circuit 210. The source of the P-type transistor M2 is coupled to the source of the P-type transistor M1.

The constant current source 230 includes an input terminal and an output terminal. The input terminal of the constant current source 230 is coupled to a voltage VCC (such as a power voltage). The output terminal of the constant current source 230 is coupled to the source of the P-type transistor M1 and the source of the P-type transistor M2, to provide a constant current I11 to the source of the P-type transistor M1 and the source of the P-type transistor M2.

The adjustable current source 240 includes an input terminal, an output terminal and a plurality of control terminals. The input terminal of the adjustable current source 240 is coupled to the voltage VCC. The output terminal of the adjustable current source 240 is coupled to the source of the P-type transistor M1 and the source of the P-type transistor M2, to provide an adjustable current I12 to the source of the P-type transistor M1 and the source of the P-type transistor M2. The plurality of control terminals of the adjustable current source 240 are used as the plurality of fifth terminals 215 of the amplifier stage circuit 210, to receive the first digital control signal DCN<255:0>. Herein, when the first digital control signal DCN<255:0> adjusts the current of the amplifier stage circuit 210, the trans conductance of the P-type transistor M1 and the trans conductance of the P-type transistor M2 are adjusted, so that the gain of the amplifier stage circuit 210 is adjusted.

The resistor R1 includes a first terminal and a second terminal. The first terminal of the resistor R1 is coupled to the drain of the P-type transistor M1. The second terminal of the resistor R1 is coupled to a ground terminal GND. The resistor R2 includes a first terminal and a second terminal. The first terminal of the resistor R2 is coupled to the drain of the P-type transistor M2. The second terminal of the resistor R2 is coupled to the ground terminal GND. The capacitor C1 includes a first terminal and a second terminal. The first terminal of the capacitor C1 is coupled to the source of the P-type transistor M1. The second terminal of the capacitor C1 is coupled to the ground terminal GND. In the embodiment, the capacitor C1 represents an analog filter.

The negative-resistance stage circuit 220 includes a P-type transistor M3, a P-type transistor M4, a constant current source 250, an adjustable current source 260 and a capacitor C2.

The P-type transistor M3 includes a gate, a drain and a source. The drain of the P-type transistor M3 is used as the second terminal 222 of the negative-resistance stage circuit 220. The P-type transistor M4 includes a gate, a drain and a source. The drain of the P-type transistor M4 is used as the first terminal 221 of the negative-resistance stage circuit 220. The gate of the P-type transistor M4 is coupled to the drain of the P-type transistor M3. The drain of the P-type transistor M4 is coupled to the gate of the P-type transistor M3. The source of the P-type transistor M4 is coupled to the source of the P-type transistor M3.

The constant current source 250 includes an input terminal and an output terminal. The input terminal of the constant current source 250 is coupled to the voltage VCC. The output terminal of the constant current source 250 is coupled to the source of the P-type transistor M3 and the source of the P-type transistor M4, to provide a constant current I21 to the source of the P-type transistor M3 and the source of the P-type transistor M4.

The adjustable current source 260 includes an input terminal, an output terminal and a plurality of control terminals. The input terminal of the adjustable current source 260 is coupled to the voltage VCC. The output terminal of the adjustable current source 260 is coupled to the source of the P-type transistor M3 and the source of the P-type transistor M4, to provide an adjustable current I22 to the source of the P-type transistor M3 and the source of the P-type transistor M4. The plurality of control terminals of the adjustable current source 260 are used as the plurality of third terminals 223 of the negative-resistance stage circuit 220, to receive the second digital control signal DCNB<255:0>. The capacitor C2 includes a first terminal and a second terminal. The first terminal of the capacitor C2 is coupled to the source of the P-type transistor M3 and the source of the P-type transistor M4. The second terminal of the capacitor C2 is coupled to the ground terminal GND. In the embodiment, the capacitor C2 represents an analog filter.

In the embodiment, the output resistance Rout of the i-th differential amplifier 110_i may be calculated using the following formula (1).

$$Rout \approx -\frac{1}{gm} // R // r_{mos} \approx \frac{R}{1-gm*R} // r_{mos} \quad (1)$$

Herein, Rout is the output resistance of the i-th differential amplifier 110_i, gm is the transconductance of the P-type transistor M3 or the P-type transistor M4, R is the resistor R1 or the resistor R2, rmos is the internal resistance of the P-type transistor M1 (or the P-type transistor M3) and the internal resistance of the P-type transistor M2 (or the P-type transistor M4) connected in parallel.

The oscillating frequency $\omega_{osc}$ of the i-th differential amplifier 110_i may be calculated using the following formula (2).

$$\omega_{osc} \approx \sqrt{3} * \left(\frac{1}{Rout*Cout}\right) \approx \sqrt{3} / \left(\frac{R}{1-gm*R} // r_{mos}\right) * \frac{1}{Cout} \quad (2)$$

wherein $\omega_{osc}$ is the oscillating frequency, Cout is the total parasitic capacitance of the second output terminal 116_i or the first output terminal 115_i of the i-th differential amplifier 110_i.

Furthermore, in the entire operation of the i-th differential amplifier 110_i, when the first digital control signal DCN<255:0>=1, indicates that the bit signals DCN<0>~DCN<255> of the first digital control signal DCN<255:0> are all at the high level (i.e., "1"). The adjustable current source 240 is completely turned off, the current of the amplifier state circuit 210 is at the lowest level and equals to the constant current I11. At this time, the second digital control signal DCNB<255:0>=0, indicates that the bit signals DCNB<0>~DCNB<255> of the second digital control signal DCNB<255:0> are all at the low level (i.e., "0"). The adjustable current source 260 is completely turned on, the current of the negative-resistance stage circuit 220 is at the highest level and equals to the sum of the adjustable current I22 of maximum value and the constant current I21. Accordingly, the negative resistance of the negative-resistance stage circuit 220 is at the highest level, so that the output impedance of the oscillator circuit 100 is at the highest level, and the oscillation frequency of the oscillator circuit 100 is at the lowest level. Herein, the negative resistance of the negative-resistance stage circuit 220 refers to the resistance of the drain of the P-type transistor M3 or the resistance of the drain of the P-type transistor M4.

When the second digital control signal DCNB<255:0>=1, indicates that the bit signals DCNB<0>~DCNB<255> of the second digital control signal DCNB<255:0> are all at the high level (i.e., "1"). The adjustable current source 260 is completely turned off, the current of the negative-resistance stage circuit 220 is at the lowest level and equals to the constant current I21. At this time, the first digital control signal DCN<255:0>=0, indicates that the bit signals DCN<0>~DCN<255> of the first digital control signal DCN<255:0> are at the low level (i.e., "0"). The adjustable current source 240 is completely turned on, the current of the amplifier stage circuit 220 is at the highest level, equals to the sum the adjustable current I12 of maximum value and the constant current I11. Accordingly, the negative resistance of the differential amplifier 110_i is at the lowest level, so that the output impedance of the oscillator circuit 100 is at the lowest level, the oscillation frequency of the oscillator circuit 100 is at the highest level.

In addition, the embodiment may set the oscillation frequency range of the oscillator circuit 100 by setting the magnitudes of the constant current I11 and the constant current I21. Since too large negative resistance of the negative-resistance stage circuit 220 causes the deadlock of the oscillator circuit 100, and too small negative resistance of the negative-resistance stage circuit 220 varies the differential oscillation generated by the oscillator circuit 100 to a single-ended oscillation, so that the auxiliary start circuit 150 may be used to set the constant current I11 and the constant current I21.

For example, increase the adjustable current I22 gradually from the minimum value to the maximum value, at this time, the adjustable current I12 is gradually decreased from the maximum value to the minimum value. Throughout the entire process, if the oscillator circuit 100 still deadlocks under the operation of the auxiliary start circuit 150, set a larger value for the constant current I11, or set a smaller value for the constant current I21, or decrease the adjustment step of the adjustable current I22.

In addition, increase the adjustable current I12 gradually increased from the minimum value to the maximum value, at this time, the adjustable current I22 is gradually decreased from the maximum value to the minimum value. Throughout the entire process, if the differential oscillation generated by the oscillator circuit 100 still changes to the single-ended oscillation under the operation of the auxiliary start circuit 150, set a larger value for the constant current I21, or set a smaller value for the constant current I11, or decrease the adjustment step of the adjustable current I12.

Through the manner above, the constant current I11, the constant current I21, the adjustment step of the adjustable current I12 and the adjustment step of the adjustable current I22 may be set appropriately, so that the oscillator circuit 100 may operate in the widest oscillation range. According to an embodiment of the present invention, the adjustment step of the adjustable current I12 equals to the adjustment step of the adjustable current I22.

Figure 3:
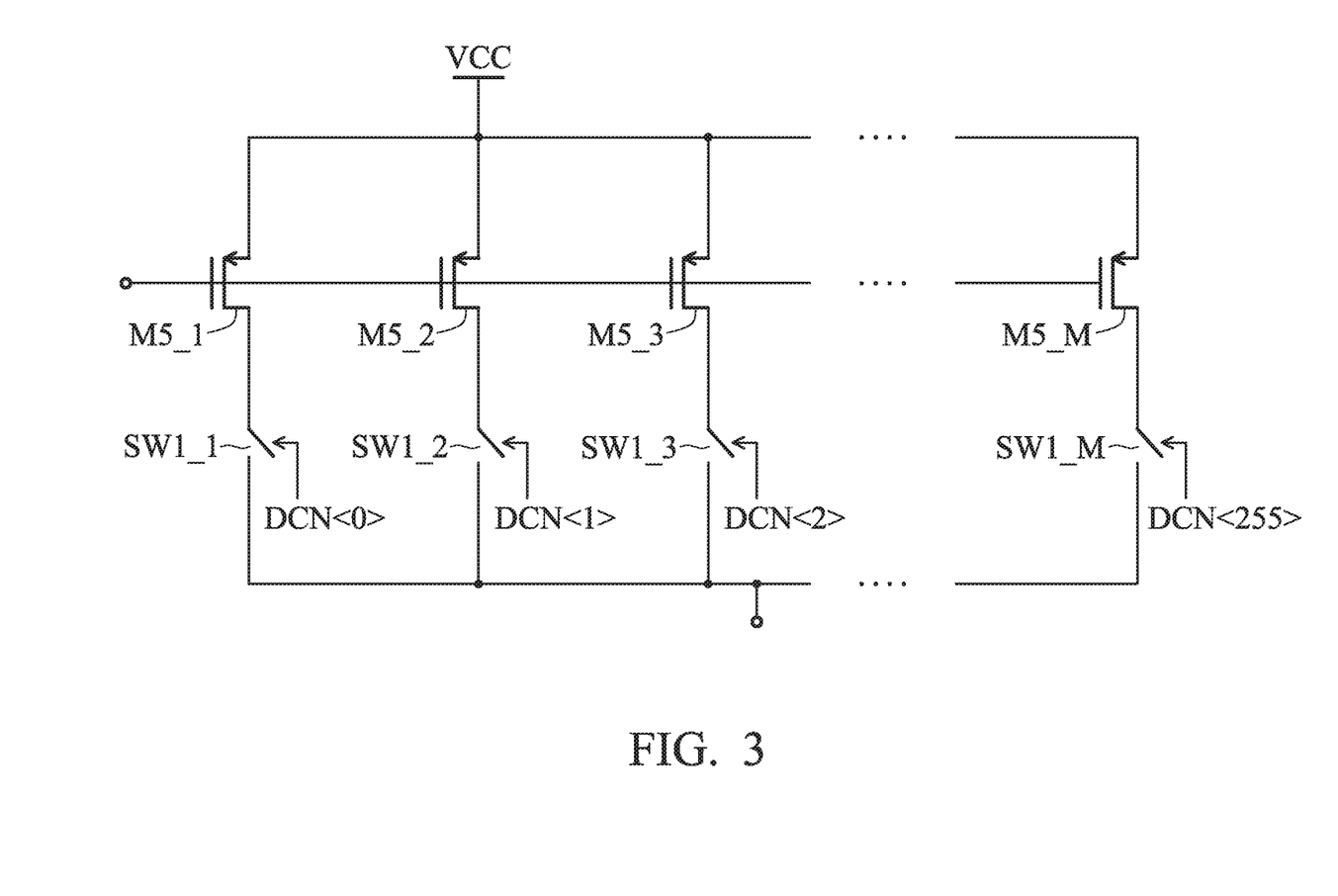
FIG. 3 is a circuit diagram of an adjustable current source 240 in FIG. 2.

FIG. 3 is a detailed circuit diagram of an adjustable current source 240 in FIG. 2. As shown in FIG. 3, the adjustable current source 240 includes M P-type transistors M5_1~M5_M and M switching units SW1_1~SW1_M, herein M is L power of 2, L is an integer greater than 1. In the embodiment, the number of the plurality of switching units SW1_1~SW1_M is equal to the bit number of first digital control signal DCN<255:0>. That is, the number M is 256, i.e., $2^8$.

The P-type transistors M5_1~M5_M respectively include a gate, a drain and a source. The gates of the P-type transistors M5_1~M5_M are coupled together and controlled by the same signal. The sources of the P-type transistors M5_1~M5_M are coupled together to serve as the input terminal of the adjustable current source 240. According to an embodiment of the present invention, the current that each of the P-type transistors M5_1~M5_M may generate is equal to the adjustment step of the adjustment current I12.

The switching units SW i_1~SW1_M respectively include a first terminal, a second terminal and a control terminal. The first terminal of the p-th switching unit SW1_p is coupled to the drain of the p-th P-type transistor M5_p, herein 1≤p≤M. For example, the first terminal of the first switching unit SW1_1 is coupled to the drain of the first P-type transistor M5_1. The first terminal of the second switching unit SW1_2 is coupled to the drain of the second P-type transistor M5_2 . . . . The first terminal of the M-th switching unit SW1_M is coupled to the drain of the M-th P-type transistor M5_M.

The second terminals of the switching units SW1_1~SW1_M are coupled together to serve as the output terminal of the adjustable current source 240. The control terminals of the M switching units SW1_1~SW1_M are used as the plurality of control terminals of the adjustable current source 240. The M control terminals of the M switching units SW1_1~SW1_M correspondingly receive the bit signals DCN<0>~DCN<255> of the first digital control signal DCN<255:0>.

Figure 4:
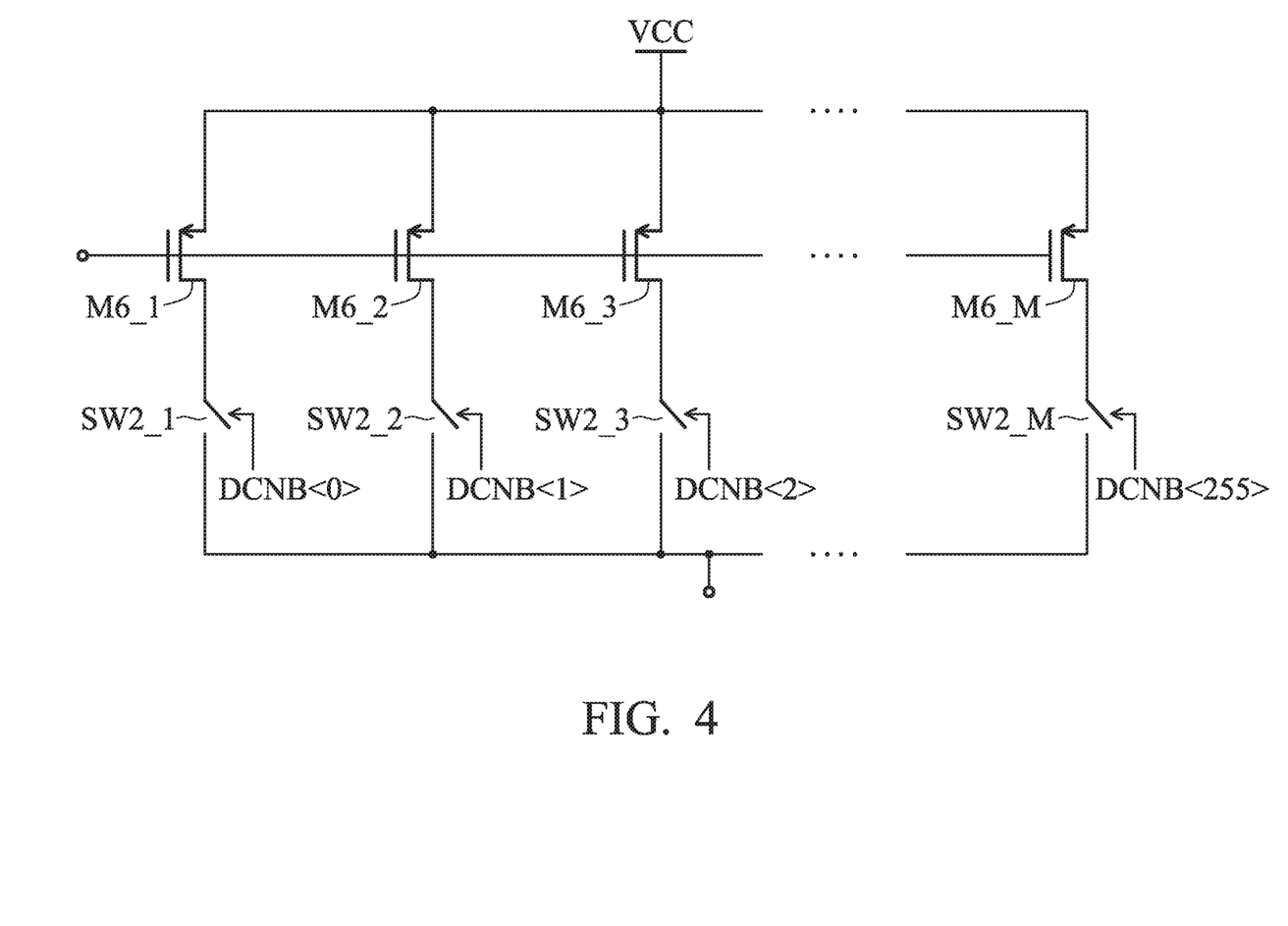
FIG. 4 is a circuit diagram of an adjustable current source 260 in FIG. 2.

FIG. 4 is a detailed circuit diagram of an adjustable current source 260 in FIG. 2. As shown in FIG. 4, the adjustable current source 260 includes M P-type transistors M6_1~M6_M and M switching units SW2_1~SW2_M, herein M is the L power of 2. In the embodiment, a number of the plurality of switching units SW2_1~SW2_M is equal to the bit number of second digital control signal DCNB<255:0>. That is, the number M switching is 256, i.e., 2⁸.

The P-type transistors M6_1~M6_M respectively includes a gate, a drain and a source. The gates of the P-type transistors M6_1~M6_M are coupled together and controlled by the same signal. The sources of the P-type transistors M6_1~M6_M are coupled together to serve as the input terminal of the adjustable current source 260. According to an embodiment of the present invention, the current that each of the P-type transistors M6_1~M6_M may generate is equal to the adjustment step of the adjustable current I22.

The switching units SW2_1~SW2_M respectively include a first terminal, a second terminal and a control terminal. The first terminal of the p-th switching unit SW2_p is coupled to the drain of the p-th P-type transistor M6_p, herein 1≤p≤M. For example, the first terminal of the first switching unit SW2_1 is coupled to the drain of the first P-type transistor M6_1. The first terminal of the second switching unit SW2_2 is coupled to the drain of the second P-type transistor M6_2 . . . . The first terminal of the M-th switching unit SW2_M is coupled to the drain of the M-th P-type transistor M6_M.

The second terminals of the switching units SW2_1~SW2_M are coupled together to serve as the output terminal of the adjustable current source 260. The M control terminals of the switching units SW2_1~SW2_M are used as the plurality of control terminals of the adjustable current source 260. The M control terminals of the M switching units SW2_1~SW2_M correspondingly receive the bit signals DCNB<0>~DCNB<255> of the second digital control signal DCNB<255:0>.

Figure 5:
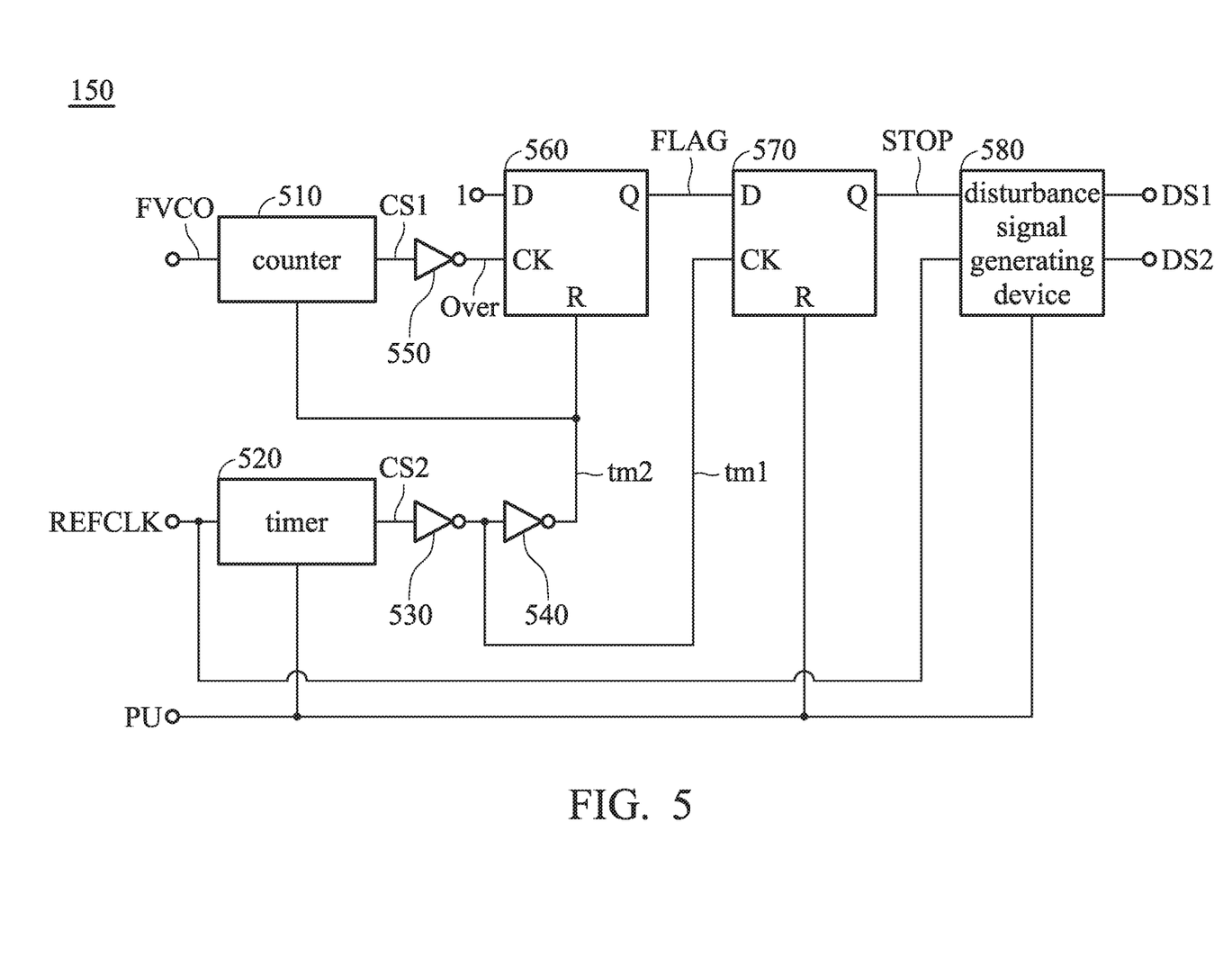
FIG. 5 is a schematic view of an auxiliary start circuit 150 in FIG. 1.

FIG. 5 is a schematic view of the auxiliary start circuit 150 in FIG. 1. As shown in FIG. 5, the auxiliary start circuit 150 includes a counter 510, a timer 520, an inverter 530, an inverter 540, an inverter 550, a D flip-flop 560, a D flip-flop 570 and a disturbance signal generating device 580.

The timer 520 includes a first input terminal, a second input terminal and an output terminal. The first input terminal of the timer 520 receives the reference clock signal REFCLK. The second input terminal of the timer 520 receives an enabling signal PU. The timer 520 generates a timing signal CS2 and outputs the timing signal CS2 from the output terminal. Herein, the second input terminal of the timer 520 is equivalent to a reset terminal of the timer 520, and the enabling signal may be used to reset/restart/enable the timer 520.

The inverter 530 includes an input terminal and an output terminal. The input terminal of the inverter 530 is coupled to the output terminal of the timer 520 to receive the timing signal CS2. The inverter 530 inverts the timing signal CS2 to generate a signal tm1, and outputs the signal tm1 from the output terminal.

The inverter 540 includes an input terminal and an output terminal. The input terminal of the inverter 540 is coupled to the output terminal of the inverter 530 to receive the signal tm1. The inverter 540 inverts the signal tm1 to generate a signal tm2, and outputs the signal tm2 from the output terminal.

The counter 510 includes a first input terminal, a second input terminal and an output terminal. The first input terminal of the counter 510 is coupled to the first input terminal 111_i of the i-th differential amplifier 110_i. In the embodiment, the first input terminal of the counter 510 is coupled to, for example, the first input terminal 111_1 of the first differential amplifier 110_1. The second input terminal of the counter 510 is coupled to the output terminal of the inverter 540 to receive the signal tm2. The counter 510 generates a counting signal CS1, and outputs the counting signal CS1 from the output terminal. Herein, the second input terminal of the counter 510 is equivalent to a reset terminal of the counter 510, and the signal tm2 may be used to reset/restart/enable the counter 510.

The inverter 550 includes an input terminal and an output terminal. The input terminal of the inverter 550 is coupled to the output terminal of the counter 510 to receive the counting signal CS1. The inverter 550 inverts the counting signal CS1 to generate a signal Over, and outputs the signal Over from the output terminal.

The D flip-flop 560 includes a data input terminal D, a clock input terminal CK, a reset terminal R and an output terminal Q. The data input terminal D of the D flip-flop 560 receives a high level signal "1". The clock input terminal CK of the D flip-flop 560 is coupled to the output terminal of the inverter 550 to receive the signal Over. The reset terminal R of the D flip-flop 560 is coupled to the output terminal of the inverter 540 to receive the signal tm2. The D flip-flop 560 generates a signal FLAG, and outputs the signal FLAG from the output terminal Q.

The D flip-flop 570 includes a data input terminal D, a clock input terminal CK, a reset terminal R and an output terminal Q. The data input terminal D of the D flip-flop 570 is coupled to the output terminal Q of the D flip-flop 560 to receive the signal FLAG. The clock input terminal CK of the D flip-flop 570 is coupled to the output terminal of the inverter 530 to receive the signal tm1. The reset terminal R of the D flip-flop 570 receives the enabling signal PU. The D flip-flop 570 generates a signal STOP, and outputs the signal STOP from the output terminal Q.

The disturbance signal generating device 580 includes a first input terminal, a second input terminal, a third input terminal, a first output terminal and a second output terminal. The first input terminal of the disturbance signal generating device 580 is coupled to the output terminal Q of the D flip-flop 570 to receive the signal STOP. The second input terminal of the disturbance signal generating device 580 receives the reference clock signal REFCLK. The third input terminal of the disturbance signal generating device 580 receives the enabling signal PU. The disturbance signal generating device 580 generates a first disturbance signal DS1, and outputs the first disturbance signal DS1 from the first output terminal. The disturbance signal generating device 580 generates a second disturbance signal DS2, and outputs the second disturbance signal DS2 from the second output terminal.

The enabling signal PU is used to turn on or turn off the auxiliary start circuit 150. When the enabling signal PU is at the low level (i.e., "0"), the auxiliary start device 150 is in a disable state, and each component of the auxiliary start circuit 150 does not work.

When the enabling signal PU is switched to the high level (i.e., "1"), the auxiliary start device 150 is started. Within the first time set by the timer 520, the signal STOP generated by the D flip-flop 570 is at the low level (i.e., "0"). At this time, the first disturbance signal DS1 and the second disturbance signal DS2 generated by the disturbance signal generating device 580 are differential output signals with the same frequency as the reference clock signal REFCLK. The first disturbance signal DS1 and the second disturbance signal DS2 are respectively output to the first input terminal 111_j and the second input terminal 112_j of the j-th differential amplifier 110_j, to disturb the N differential amplifiers 110_1~110_N. Accordingly, regardless of whether the N differential amplifiers 110_1~110_N oscillate normally, the input signals of the j-th differential amplifier 110_j is disturbed to make the differential amplifiers 110_1~110_N oscillate, so that the status of the signal FVCO of the first input terminal of the i-th differential amplifier 110_i starts or continues oscillating.

Then, when the first time set by the timer 520 expires, the carry output of the timer 520 occurs, so that the timing signal CS2 generated by the timer 520 is converted from the low level (i.e., "0") to the high level (i.e., "1"). The timing signal CS2 at the high level (i.e., "1") is input to the input terminal of the inverter 530, so that the signal tm1 outputted by the output terminal of the inverter 530 is at the low level (i.e., "0"). Afterward, the signal tm1 at the low level (i.e., "0") is input to the input terminal of the inverter 540, so that the signal tm2 outputted by the output terminal of the inverter 540 is at the high level (i.e., "1").

Thereafter, within a second time set by the timer 520 again, the signal tm2 at the high level (i.e., "1") is input to the second input terminal of the counter 510, and the counter 510 starts to count the pulses of the signal FVCO. When the counter 510 counts up to a threshold value for the first time within a fixed period of time, the counting signal CS1 generated by the counter 510 is converted from the low level (i.e., "0") to the high level (i.e., "1"). Afterward, the counting signal CS1 at the high level (i.e., "1") is input to the input terminal of the inverter 550, so that the signal Over outputted by the output terminal of the inverter 550 is converted to the low level (i.e., "0"). When the counter 510 counts up to the threshold again within the next same fixed period of time, the counting signal CS1 generated by the counter 510 is converted from the high level (i.e., "1") to the low level (i.e., "0"). Afterward, the counting signal CS1 at the low level (i.e., "0") is input to the input terminal of the inverter 550, so that the signal Over outputted by the output terminal of the inverter 550 is converted to the high level (i.e., "1"). Then, the signal Over at the high level (i.e., "1") is input to the clock input terminal CK of the D flip-flop 560 to trigger the D flip-flop 560, so that the signal FLAG outputted by the output terminal of the D flip-flop 560 is converted to the high level (i.e., "1").

Afterward, when the second time set by the timer 520 expires, the timing signal CS2 generated by the timer 520 is converted from the high level (i.e., "1") to the low level (i.e., "0"). Then, the timing signal CS2 at the low level (i.e., "0") is input to the input terminal of the inverter 530, so that the signal tm1 outputted by the output terminal of the inverter 530 is at the high level (i.e., "1"). Afterward, the signal tm1 at the high level (i.e., "1") is input to the clock input terminal CK of the D flip-flop 570 to trigger the D flip-flop 570, so that the signal STOP outputted by the output terminal of the D flip-flop 570 is at the high level (i.e., "1"). Then, the signal STOP at the high level (i.e., "1") is input to the disturbance signal generating device, so that the first disturbance signal DS1 and the second disturbance signal DS2 generated by the disturbance signal generating device 580 is at the high impedance (High-z) state, so as to stop the disturbance operation on the differential amplifiers 110_1~110_N.

Thereafter, within a third time set by the timer 520 again, the auxiliary start circuit 150 clears the signal FLAG generated by the D flip-flop 560. Within a fourth time that the timer 520 continuous to set, the counter 510 may continue to count the signal FVCO of the first input terminal 111_i of the i-th differential amplifier 110_i. If the signal state of the signal FVCO is normal oscillating, the signal FLAG outputted by the D flip-flop 560 may be converted to the high level (i.e., "1") and the signal STOP outputted by the output terminal of the D flip-flop 570 may also be converted to the high level (i.e., "1"). Therefore, the first disturbance signal DS1 and the second disturbance signal DS2 generated by the disturbance signal generating device 580 are converted to the high impedance (High-z) state, so that the auxiliary start circuit 150 stop disturbing the differential amplifiers 110_1~110_N. Accordingly, the differential amplifiers 110_1~110_N (i.e., the oscillator circuit 100) oscillate normally and are not be affected. Herein, the first time, the second time, the third time and the fourth time are equal. In addition, the high impedance (High-z) state of the first disturbance signal DS1 and the second disturbance signal DS2 is relative to the first input terminal and the second input terminal of the j-th differential amplifier 110_j.

Once the differential amplifiers 110_1~110_N (i.e., the oscillator circuit 100) stops oscillating, the signal state of the signal FVCO is no oscillation, so that the signal FLAG outputted by the second terminal of the D flip-flop 560 is converted to the low level (i.e., "0") and remain at the low level (i.e., "0"). Then, since the signal FLAG is at the low level, the signal STOP generated by the D flip-flop 570 may be converted to the low level (i.e., "0") again, so that the first disturbance signal DS1 and the second disturbance signal DS2 generated by the disturbance signal generating device 580 are the differential output signals with the same frequency as the reference clock signal REFCLK, so as to perform the disturbance operation on the differential amplifiers 110_1~110_N (i.e., the oscillator circuit).

That is, when the oscillator circuit 100 is started, the auxiliary start circuit 150 provides the differential output signals DS1 and DS2 with the same frequency as the reference clock signal REFCLK to the first input terminal 111_j and the second input terminal 112_j of the j-th differential amplifier 110_j, so that the oscillator circuit 100 oscillates. Then, the auxiliary start circuit 150 monitors the oscillation state of the oscillator circuit 100 according to the signal state of the signal FVCO of the first input terminal 111_i of the i-th differential amplifier 110_i. When the oscillation state of the oscillator circuit 100 is no oscillation, the auxiliary start circuit 150 provides the differential output signals DS1 and DS2 with the same frequency as the reference clock signal REFCLK again. When the oscillation state of the oscillator circuit 100 is oscillating, the auxiliary start circuit 150 converts the first disturbance signal DS1 and the second disturbance signal DS2 into the high impedance (High-z) state, so that the normal oscillation of the oscillator circuit 100 may not be affected. Therefore, the normal oscillation of the oscillator circuit may be effectively ensured.

In summary, according to the oscillator circuit disclosed by the present invention, the negative resistance of the differential amplifier is controlled by the first digital control signal and the second digital control signal to control the ratio of the negative resistance and the positive resistance of the differential amplifier, so as to adjust the oscillation frequency of the oscillator circuit, so that the differential amplifier is insensitive to the power supply noise. In addition, the auxiliary start circuit generates the first disturbance signal and the second disturbance signal to the first input terminal and the second input terminal of the j-th differential amplifier according to the signal state of the first input terminal of the i-th differential amplifier, and the auxiliary start circuit may be used to calibrate the frequency range to be maximum, herein the frequency range is that the oscillator may oscillate. Therefore, the oscillator circuit may reject the power supply noise and widen the frequency range of oscillation, and ensure the normal oscillation of the oscillator circuit.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An oscillator circuit, comprising:
a plurality of differential amplifiers, connected in series, each of said plurality of differential amplifiers comprising a first input terminal, a second input terminal, a third input terminal, a fourth input terminal, a first output terminal and a second output terminal, wherein said third input terminal of each of said plurality of differential amplifiers receives a first digital control signal, said fourth input terminal of each of said plurality of differential amplifiers receives a second digital control signal, said first output terminal of each of said plurality of differential amplifiers is coupled to said first input terminal of a next one of said plurality of differential amplifiers, said second output terminal of each of said plurality of differential amplifiers is coupled to said second input terminal of said next one of said plurality of differential amplifiers, said first output terminal of the last one of said plurality of differential amplifiers is coupled to said second input terminal of the first one of said plurality of differential amplifier, and said second output terminal of said last one of said plurality of differential amplifiers is coupled to said first input terminal of said first one of said plurality of differential amplifiers; and
an auxiliary start circuit, coupled to said first input terminal of a first differential amplifier, said first input terminal of a second differential amplifier and said second input terminal of said second differential amplifier, generating a first disturbance signal and a second disturbance signal to said first input terminal of said second differential amplifier and said second input terminal of said second differential amplifier according to a signal state of said first input terminal of said first differential amplifier;
wherein said first differential amplifier is one of said plurality of differential amplifiers, and said second differential amplifier is another one of said plurality of differential amplifier;
wherein said auxiliary start circuit further receives a reference clock signal to make frequencies of said first disturbance signal and said second disturbance signal are the same as a frequency of said reference clock signal, so as to oscillate said plurality of differential amplifiers.

2. The oscillator circuit as claimed in claim 1, wherein said first digital control signal is inverse of said second digital control signal.

3. The oscillator circuit as claimed in claim 1, wherein said first digital control signal and said second digital control signal are mixed coding of a thermometer code and a binary code.

4. The oscillator circuit as claimed in claim 1, wherein said first disturbance signal is inverse of said second disturbance signal.

5. The oscillator circuit as claimed in claim 1, wherein said first differential amplifier comprises:
an amplifier stage circuit, comprising a first terminal, a second terminal, a third terminal, a fourth terminal and a fifth terminal, wherein said first terminal of said amplifier stage circuit is configured as said first input terminal of said first differential amplifier, said second terminal of said amplifier stage circuit is configured as said second input terminal of said first differential amplifier, said third terminal of said amplifier stage circuit is coupled to said second output terminal of said first differential amplifier, said fourth terminal of said amplifier stage circuit is coupled to said first output terminal of said first differential amplifier, and said fifth terminal of said amplifier stage circuit is configured as said third input terminal of said first differential amplifier to receive said first digital control signal, so as to adjust a gain of said first differential amplifier; and
a negative-resistance stage circuit, comprising a first terminal, a second terminal and a third terminal, wherein said first terminal of said negative-resistance stage circuit is configured as said first output terminal of said first differential amplifier, said second terminal of said negative-resistance stage circuit is configured as said second output terminal of said first differential amplifier, and said third terminal of said negative-resistance stage circuit is configured as said fourth input terminal of said first differential amplifier to receive said second digital control signal, so as to adjust a negative-resistance of said first differential amplifier.

6. The oscillator circuit as claimed in claim 5, wherein said amplifier stage circuit comprises:
a first transistor, comprising a first terminal, a second terminal and a third terminal, said first terminal of said first transistor is configured as said first terminal of said amplifier stage circuit, and said second terminal of said first transistor is configured as said third terminal of said amplifier stage circuit;
a second transistor, comprising a first terminal, a second terminal and a third terminal, said first terminal of said second transistor is configured as said second terminal of said amplifier stage circuit, said second terminal of said second transistor is configured as said fourth terminal of said amplifier stage circuit, and said third terminal of said second transistor is coupled to said third terminal of said first transistor;
a first constant current source, comprising a first terminal and a second terminal, said first terminal of said first constant current source is coupled to a power supply terminal, said second terminal of said first constant current source is coupled to said third terminal of said first transistor, and said first constant current source provides a first constant current;
a first adjustable current source, comprising a first terminal, a second terminal and a control terminal, said first terminal of said first adjustable current source is coupled to said power supply terminal, said second terminal of said first adjustable current source is coupled to said third terminal of said first transistor, and said control terminal of said first adjustable current source is configured as said fifth terminal of said amplifier stage circuit to receive said first digital control signal;
a first resistor, comprising a first terminal and a second terminal, said first terminal of said first resistor is coupled to said second terminal of said first transistor, and said second terminal of said first resistor is coupled to a ground terminal;
a second resistor, comprising a first terminal and a second terminal, said first terminal of said second resistor is coupled to said second terminal of said second transistor, and said second terminal of said second resistor is coupled to said ground terminal; and
a first capacitor, comprising a first terminal and a second terminal, said first terminal of said first capacitor is coupled to said third terminal of said first transistor, and said second terminal of said first capacitor is coupled to said ground terminal.

7. The oscillator circuit as claimed in claim 6, wherein said first adjustable current source comprises:
a plurality of third transistors, respectively comprising a first terminal, a second terminal and a third terminal, a plurality of first terminals of said plurality of third transistors are coupled together, and a plurality of second terminals of said plurality of third transistors are coupled together to be configured as said first terminal of said first adjustable current source; and
a plurality of switching units, respectively comprising a first terminal, a second terminal, and a control terminal, said first terminal of each of said plurality of switching units is coupled to said third terminal of one of said plurality of third transistors, said second terminal of each of said plurality of switching units is coupled with each other to be configured as said second terminal of said first adjustable current source, and said control terminal of each of said plurality of switching units is coupled to said fifth terminal of said amplifier stage circuit.

8. The oscillator circuit as claimed in claim 5, wherein said negative-resistance stage circuit comprises:
a third transistor, comprising a first terminal, a second terminal and a third terminal, said first terminal of said third transistor is configured as said second terminal of said negative-resistance stage circuit;
a fourth transistor, comprising a first terminal, a second terminal and a third terminal, said first terminal of said fourth transistor is configured as said first terminal of said negative-resistance stage circuit, said first terminal of said fourth transistor is coupled to said second terminal of said third transistor, said second terminal of said fourth transistor is coupled to said first terminal of said third transistor, and said third terminal of said fourth transistor is coupled to said third terminal of said third transistor;
a second constant current source, comprising a first terminal and a second terminal, said first terminal of said second constant current source is coupled to a power supply terminal, said second terminal of said second constant current source is coupled to said third terminal of said third transistor, and said second constant current source provides a second constant current;
a second adjustable current source, comprising a first terminal, a second terminal and a control terminal, said first terminal of said second adjustable current source is coupled to said power supply terminal, said second terminal of said second adjustable current source is coupled to said third terminal of said third transistor, and said control terminal of said second adjustable current source is configured as said third terminal of said negative-resistance stage circuit to receive said second digital control signal; and
a second capacitor, comprising a first terminal and a second terminal, said first terminal of said second capacitor is coupled to said third terminal of said third transistor, and said second terminal of said second capacitor is coupled to a ground terminal.

9. The oscillator circuit as claimed in claim 8, wherein said second adjustable current source comprises:
a plurality of fifth transistors, respectively comprising a first terminal, a second terminal and a third terminal, a plurality of first terminals of said plurality of fifth transistors are coupled together, and a plurality of second terminals of said plurality of fifth transistors are coupled together to be configured as said first terminal of said second adjustable current source; and
a plurality of switching units, respectively comprising a first terminal, a second terminal and a control terminal, said first terminal of each of said plurality of switching units is coupled to said third terminal of one of said plurality of fifth transistors, said second terminal of each of said plurality of switching units is coupled with each other to be configured as said second terminal of said second adjustable current source, and said control terminal of each of said plurality of switching units is coupled to said third terminal of said negative-resistance stage circuit.

10. The oscillator circuit as claimed in claim 1, wherein said auxiliary start circuit comprises:
a counter, comprising a first terminal, a second terminal and a third terminal, said first terminal of said counter is coupled to said first input terminal of said first differential amplifier, and said third terminal of said counter outputs a counting signal;
a timer, comprising a first terminal, a second terminal and a third terminal, said first terminal of said timer receives a reference clock signal, said second terminal of said timer receives an enabling signal, and said third terminal of said timer outputs a timing signal;

a first inverter, comprising a first terminal and a second terminal, said first terminal of said first inverter is coupled to said third terminal of said timer, and said second terminal of said first inverter outputs a first output signal;

a second inverter, comprising a first terminal and a second terminal, said first terminal of said second inverter is coupled to said second terminal of said first inverter, said second terminal of said second inverter is coupled to said second terminal of said counter, and said second terminal of said second inverter outputs a second output signal;

a third inverter, comprising a first terminal and a second terminal, said first terminal of said third inverter is coupled to said third terminal of said counter, and said second terminal of said third inverter outputs a third output signal;

a first flip-flop, comprising a first terminal, a second terminal, a third terminal and a fourth terminal, said first terminal of said first flip-flop receives a high level signal, said second terminal of said first flip-flop is coupled to said second terminal of said third inverter, said third terminal of said first flip-flop is coupled to said second terminal of said second inverter, and said fourth terminal of said first flip-flop outputs a fourth output signal;

a second flip-flop, comprising a first terminal, a second terminal, a third terminal and a fourth terminal, said first terminal of said second flip-flop is coupled to said fourth terminal of said first flip-flop, said second terminal of said second flip-flop is coupled to said second terminal of said first inverter, said third terminal of said second flip-flop receives said enabling signal, and said fourth terminal of said second flip-flop outputs a fifth output signal; and a disturbance signal generating device, comprising a first terminal, a second terminal, a third terminal, a fourth terminal and a fifth terminal, said first terminal of said disturbance signal generating device is coupled to said fourth terminal of said second flip-flop, said second terminal of said disturbance signal generating device receives said reference clock signal, said third terminal of said disturbance signal generating device receives said enabling signal, said fourth terminal of said disturbance signal generating device outputs said first disturbance signal, and said fifth terminal of said disturbance signal generating device outputs said second disturbance signal.

* * * * *